United States Patent [19]
Li et al.

[11] Patent Number: 6,010,949
[45] Date of Patent: Jan. 4, 2000

[54] METHOD FOR REMOVING SILICON NITRIDE IN THE FABRICATION OF SEMICONDUCTOR DEVICES

[75] Inventors: Li Li; Zhiqiang Wu, both of Meridian; Richard C. Hawthorne; Elvia M. Hawthorne, both of Nampa, all of Id.

[73] Assignee: Micron Technology, Inc., Boise, Id.

[21] Appl. No.: 08/734,358

[22] Filed: Oct. 21, 1996

[51] Int. Cl.[7] .................................................. H01L 21/30
[52] U.S. Cl. .......................... 438/439; 438/297; 438/443
[58] Field of Search ..................................... 438/297, 439, 438/443, 773, 774, 775

[56] References Cited

U.S. PATENT DOCUMENTS

| | | | |
|---|---|---|---|
| 4,293,590 | 10/1981 | Takagi et al. . | |
| 4,296,146 | 10/1981 | Penn | 427/58 |
| 4,855,952 | 8/1989 | Kiyosumi | 365/149 |
| 4,861,424 | 8/1989 | Fujimura et al. | 156/643 |
| 5,037,506 | 8/1991 | Gupta et al. | 156/646 |
| 5,298,112 | 3/1994 | Hayasaka et al. | 156/643 |
| 5,369,061 | 11/1994 | Nagayama | 437/228 |
| 5,371,035 | 12/1994 | Pfiester et al. . | |
| 5,403,436 | 4/1995 | Fujimura et al. | 156/643 |
| 5,817,581 | 12/1998 | Bayer et al. . | |

OTHER PUBLICATIONS

Wolf et al., Silicon Processing for the VISI Era, vol. 1, pp. 216–218 and 221–222, 1986.

K. Hirose et al., "Ion–Implanted Photoresist and Damage–Free Stripping", *J. Electrochem. Soc.*, 141 192–205 (1994).

Y. Ohmura et al., "Enhanced hydrogena and acceptor passivation in Si by pressurized water boiling", *Appl. Phys. Lett.*, 67 64–66 (1995).

A.L.P. Rotondaro et al., "A Semi–Quantitative Method for Studying Photoresist Stripping", 6 pps. [Abstract].

*Primary Examiner*—Chandra Chaudhari
*Assistant Examiner*—Scot J. Hawranek
*Attorney, Agent, or Firm*—Mueting, Raasch & Gebhardt, P.A.

[57] ABSTRACT

A method for use in the fabrication of semiconductor devices in accordance with the present invention includes providing a silicon nitride region and oxidizing a region of material in proximity to the silicon nitride region. The silicon nitride region is then hydrogenated and thereafter, the hydrogenated silicon nitride region is removed. The hydrogenation step may include immersing the silicon nitride region into pressurized boiling water and/or treating the silicon nitride region with pressurized water vapor and the removing step includes removing the hydrogenated silicon nitride region with hot phosphoric acid. The method may be used in a local oxidation of silicon process. Further, the oxidation of the material and the hydrogenation of the silicon nitride may be performed in the same pressurizable unit.

37 Claims, 5 Drawing Sheets

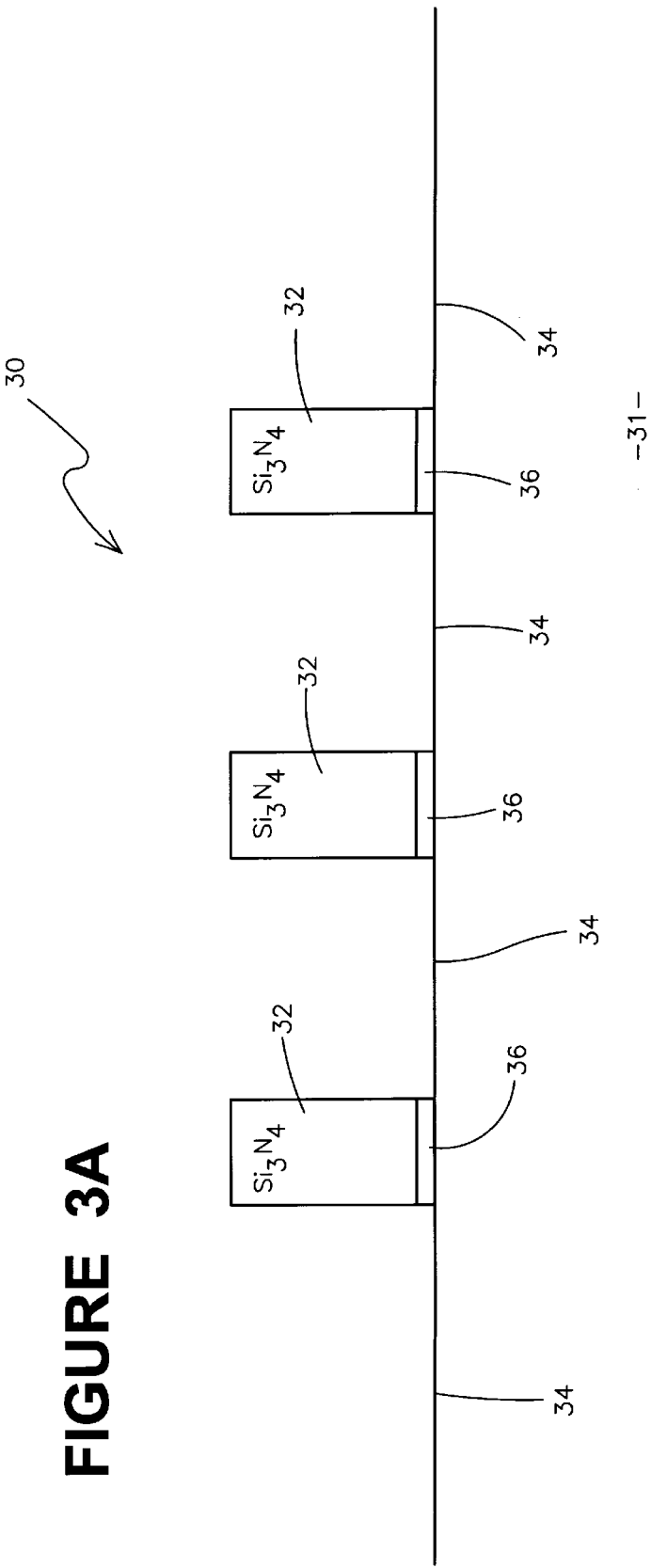

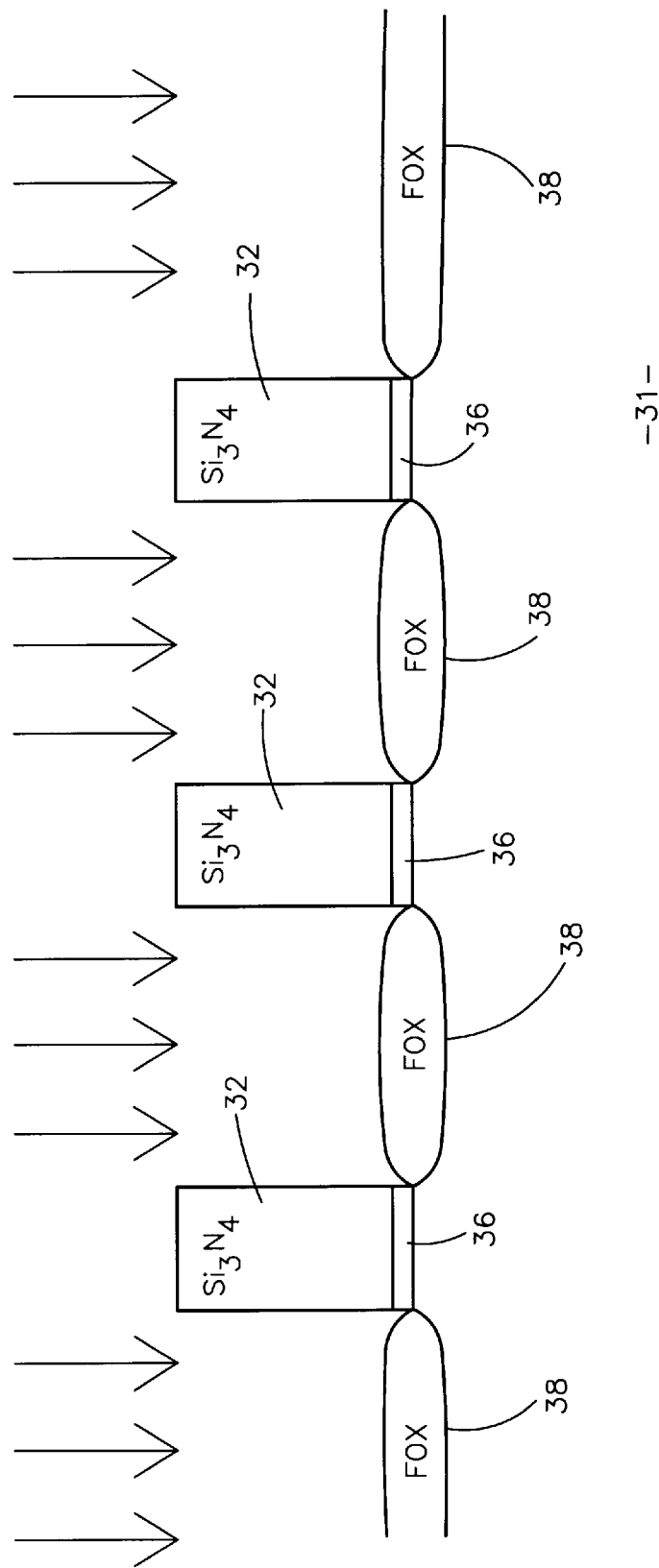

METHOD FOR REMOVING SILICON NITRIDE IN THE FABRICATION OF SEMICONDUCTOR DEVICES

FIELD OF THE INVENTION

The present invention relates to the fabrication of semiconductor devices. In particular, the present invention relates to methods of removing silicon nitride in the fabrication of semiconductor devices.

BACKGROUND OF THE INVENTION

Silicon nitride plays a major role in the fabrication of semiconductor devices in which the critical dimensions of, as well as positions of, various elements, such as, for example, transistors, resistors, and interconnects, are precisely determined on the wafer and fabricated. Silicon nitride may be used, for example, as a spacer or as a mask. In many circumstances, it is necessary to remove the silicon nitride from the wafer prior to proceeding with further processing. In order to provide adequate throughput for processing the semiconductor devices, the removal of the silicon nitride should be performed as quickly as possible, without damage to regions underlying the silicon nitride and with the desired selectivity to such underlying regions.

In particular, silicon nitride is used as a hard mask for definition of active regions of devices. For example, silicon nitride is utilized in the local oxidation of silicon (LOCOS) process as an oxidation mask. The oxidation mask allows for growth of field oxidation regions between active areas later processed in accordance with conventional techniques, such as for the fabrication of CMOS memory devices. After the field oxidation formation is completed, the silicon nitride hard mask is removed.

However, the field oxide growth process drives hydrogen out of the silicon nitride hard mask which typically has a film composition that may be expressed as $Si_xN_yH_z$. This reduction in hydrogen concentration of the silicon nitride hard mask causes difficulty to the silicon hard mask removal process, which typically includes the use of a hot phosphoric acid ($H_3PO_4$) strip. For example, with hydrogen driven from the silicon nitride hard mask, the speed at which the silicon nitride hard mask is removed by the hot phosphoric acid treatment is substantially decreased.

As a result of the time consuming conventional silicon nitride removal processes, throughput of wafers being fabricated is decreased. Therefore, there is a need in the art for improved silicon nitride removal methods.

SUMMARY OF THE INVENTION

A method for use in the fabrication of semiconductor devices in accordance with the present invention includes providing a silicon nitride region and oxidizing a region of material in proximity to the silicon nitride region. The silicon nitride region is then hydrogenated and thereafter, the hydrogenated silicon nitride region is removed.

In various embodiments of the invention, the hydrogenation step includes the step of immersing the silicon nitride region into pressurized boiling water and/or treating the silicon nitride region with pressurized water vapor.

A method of removing silicon nitride in a local oxidation of silicon process is also described. A silicon substrate is provided. A silicon nitride region is also provided over the silicon substrate leaving exposed areas of silicon substrate. The exposed areas are oxidized. The hydrogen concentration of the silicon nitride region is increased from a first concentration resulting from the oxidation step to a second concentration higher than the first concentration. The hydrogenated silicon nitride region is then removed using hot phosphoric acid.

In one embodiment, the increasing step may include increasing the hydrogen concentration from the first concentration to a second concentration substantially equivalent to or greater than the hydrogen concentration of the silicon nitride region prior to the oxidation step. Further, the oxidation step may be performed in a high pressure oxidation device and the hydrogen concentration increasing step may be performed in the same high pressure oxidation device using pressurized water vapor.

A method of etching silicon nitride in a local oxidation of silicon process is also described. The method includes providing a silicon substrate and a silicon nitride hard mask located relative to the silicon substrate exposing areas of silicon substrate. The exposed areas of silicon substrate are oxidized. Thereafter, the hydrogen concentration of the silicon nitride hard mask is increased and the hydrogenated silicon nitride hard mask is removed.

In various embodiments of the invention, the increasing step includes hydrogenating the silicon nitride hard mask by immersion into pressurized boiling water and/or treating the silicon nitride mask with pressurized water vapor.

An etching method for removing a silicon nitride region having a reduced hydrogen concentration after oxidation of nearby material is also described. The method includes hydrogenating the silicon nitride region by immersing the silicon nitride region in pressurized boiling water and then removing the hydrogenated silicon nitride region.

Further, another etching method for removing a silicon nitride region having a reduced hydrogen concentration after oxidation of nearby material is described. The method includes hydrogenating the silicon nitride region by treating the silicon nitride region with pressurized water vapor and then removing the hydrogenated silicon nitride region.

Yet further, an etching method for removing a silicon nitride region having a reduced hydrogen concentration after high pressure oxidation of material in proximity to the silicon nitride region in a high pressure oxidation device is described. The method includes hydrogenating the silicon nitride region by treating the silicon nitride region with pressurized water vapor using the high pressure oxidation device and then removing the hydrogenated silicon nitride region.

BRIEF DESCRIPTION OF THE DRAWINGS

FIGS. 3A–3C generally illustrate the steps of a LOCOS process in accordance with the present invention. FIG. 3A is a cross-sectional illustration of a substrate having a silicon nitride hard mask formed thereon. FIG. 3B is a cross-sectional illustration showing the formation of field oxide using the silicon nitride hard mask shown in FIG. 3A. FIG. 3C is the cross-sectional illustration showing the resulting field oxide regions after the removal of the silicon nitride hard mask in accordance with the present invention.

DETAILED DESCRIPTION OF THE EMBODIMENTS

Figure 1:
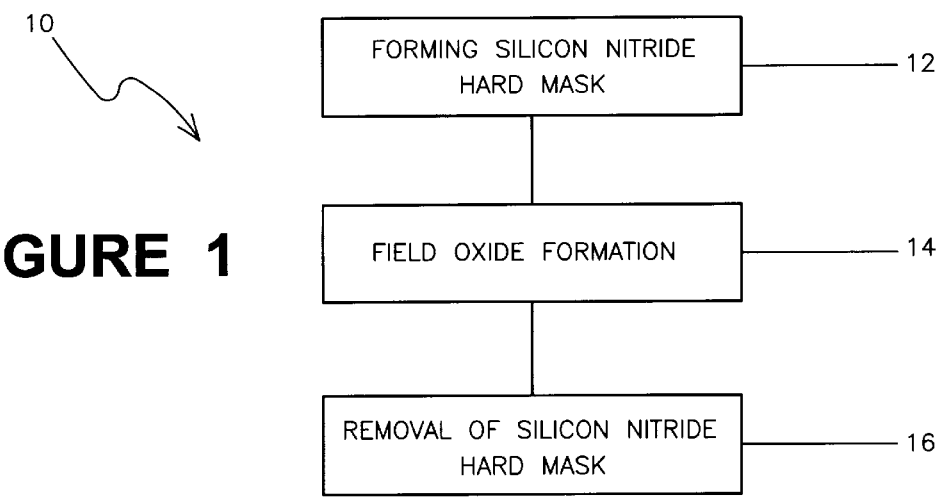
FIG. 1 is a flow diagram generally illustrating the use of a silicon nitride hard mask in a LOCOS process including the removal of the silicon nitride hard mask in accordance with the present invention.
Figure 2:
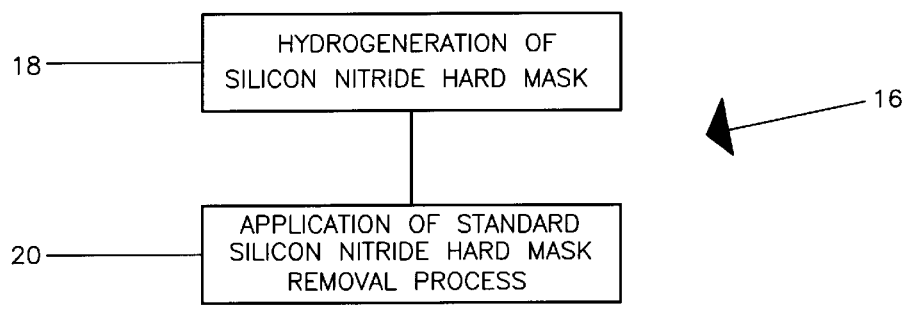
FIG. 2 is a flow diagram of the silicon nitride hard mask removal step of FIG. 1.
Figure 3C:
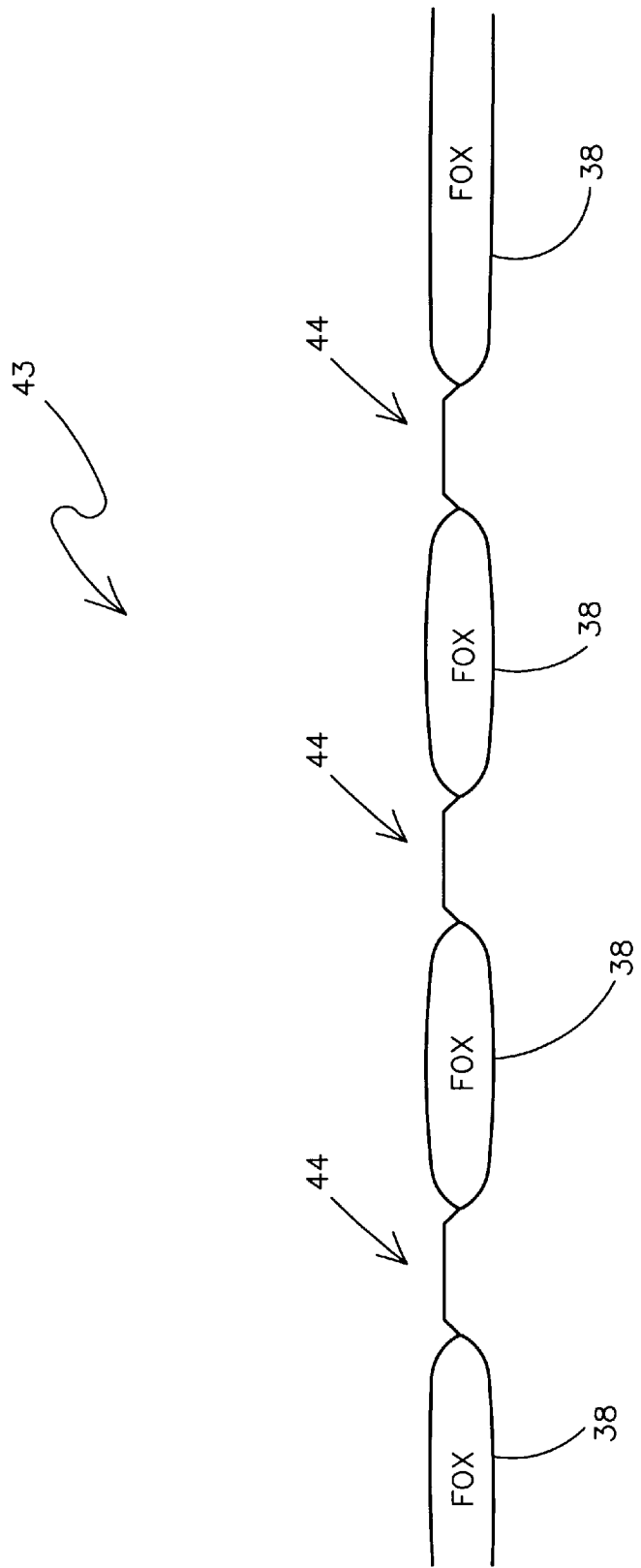

FIGS. 1 and 2 are flow diagrams generally showing the process flow of a LOCOS process including a silicon nitride removal method in accordance with the present invention for use in the fabrication of semiconductor devices. FIGS. 3A–3C show cross-sectional illustrations showing LOCOS processing steps for use in the fabrication of semiconductor devices in accordance with the present invention. It should be readily apparent that the processing steps described are only a portion of the entire fabrication process.

The present invention pertains to the method of removing silicon nitride in the fabrication of semiconductor devices. However, the present invention is in no manner limited to the removal of a silicon nitride hard mask utilized in the LOCOS process as described herein for illustrating such silicon nitride removal in accordance with the present invention. Rather, the silicon nitride removal method in accordance with the present invention may be beneficial for any fabrication process where silicon nitride is removed after the hydrogen concentration of the silicon nitride has been reduced by application of other processing steps. As such, the present invention is not limited to use of the silicon nitride removal method in the LOCOS process, but only as described in the accompanying claims.

FIG. 1 generally illustrates the steps for utilizing a silicon nitride hard mask in a LOCOS process 10. Generally, a silicon nitride hard mask is formed as shown in block 12, field oxide regions are then formed as defined by the silicon nitride hard mask (block 14), and the silicon nitride hard mask is then removed as shown in block 16.

The field oxide growth process drives hydrogen out of the silicon nitride hard mask which has a film composition that typically includes hydrogen and which may be expressed as $Si_xN_yH_z$. In accordance with the present invention, the removal of the silicon nitride hard mask having a reduced hydrogen concentration (block 16) is further detailed by the general flow diagram of FIG. 2. The removal of the silicon nitride hard mask (block 16) includes the step of hydrogenating the silicon nitride hard mask as represented by block 18, and then removing the hydrogenated silicon nitride hard mask by application of a standard silicon nitride removal process (block 20).

The methods in accordance with the present invention as shown by the flow diagrams of FIG. 1 and 2 shall further be described in detail with reference to FIGS. 3A–3C. Oxygen and water move very slowly through silicon nitride. Therefore, when silicon nitride 32 is patterned over silicon substrate 31 as shown in the device structure 30 of FIG. 3A, the silicon nitride hard mask 32 constitutes an efficient oxidation mask which prevents oxidants from reaching the silicon surface covered by the silicon nitride hard mask 32. The silicon nitride hard mask 32 is used to permit the local oxidation of the silicon and form isolation regions in the regions 34 exposed using the silicon nitride hard mask 32. This LOCOS process is widely known to those skilled in the art to isolate regions in silicon, commonly referred to as active areas, where devices, such as memory devices, are later constructed with further known processing techniques.

The silicon nitride hard mask 32 as shown in FIG. 3A, can be formed in any manner as known to those skilled in the art for forming a silicon nitride hard mask to be used for a LOCOS process. For example, the silicon nitride hard mask may be grown directly on the silicon by reacting nitrogen or a nitrogen compound, such as ammonia with the silicon surface at elevated temperature, typically about 900° C. to about 1300° C. Further, for example, the silicon nitride hard mask may be deposited by conventional chemical vapor deposition (CVD) or conventional low pressure chemical vapor deposition (LPCVD), such as by reacting silane with ammonia at about 700° C. to 900° C. and at atmospheric pressure or by the reaction of dichlorosilane and ammonia at a temperature of about 650° C. to about 800° C. and at a pressure in the range of about 50 mTorr to about 700 mTorr. The silicon nitride deposited typically contains bonded hydrogen in the form of Si—H and/or N—H bonds. In addition to silicon nitride growth and CVD/LPCVD formation of silicon nitride, other deposition methods and conditions are also suitable for formation of the silicon nitride in the LOCOS process. For example, such processes may include plasma enhanced chemical vapor deposition processes at temperatures less than about 350° C., and also chemical physical deposition processes and rapid thermal chemical vapor deposition processes.

Further, for example, the LOCOS process may also include depositing the silicon nitride on a pad oxide 36 as shown in FIG. 3A. In addition, the silicon nitride may be deposited on any other layers or films utilized in similar processes, such as a polysilicon buffer film as used in polysilicon buffer LOCOS processes.

The silicon nitride grown or deposited is then patterned by conventional photolithography and etch techniques. For example, the silicon nitride may be patterned with a conventional photoresist and then dry etched with a plasma including a fluorine containing gas such as $CF_4$, $SF_6$ or $NF_3$, alone or combination with oxygen, chlorine, or any other plasma as known to those skilled in the art for etching silicon nitride, particularly in the LOCOS process. The silicon nitride may also be wet etched.

The silicon substrate areas 34 exposed after formation of the silicon nitride hard mask 32 are then subjected to oxidation for forming the field oxide regions 38 as shown in FIG. 3B. For example, the field oxide regions 38 may be formed using wet oxidation (represented by arrows 37) at temperatures greater than about 700° C. for a period of time in the range of about 2 to about 4 hours. These temperatures can be reduced by use of high pressure oxidation (HiPOX) which utilizes a high pressure unit for the growth of the field oxide regions 38 at a pressure of, for example, up to about 25 atmospheres, and at a temperature, for example, in the range of about 600° C. to about 1100° C. The thickness of the oxide regions 38 grown are typically in the range of about 0.25 microns to about 1 micron.

Figure 4:
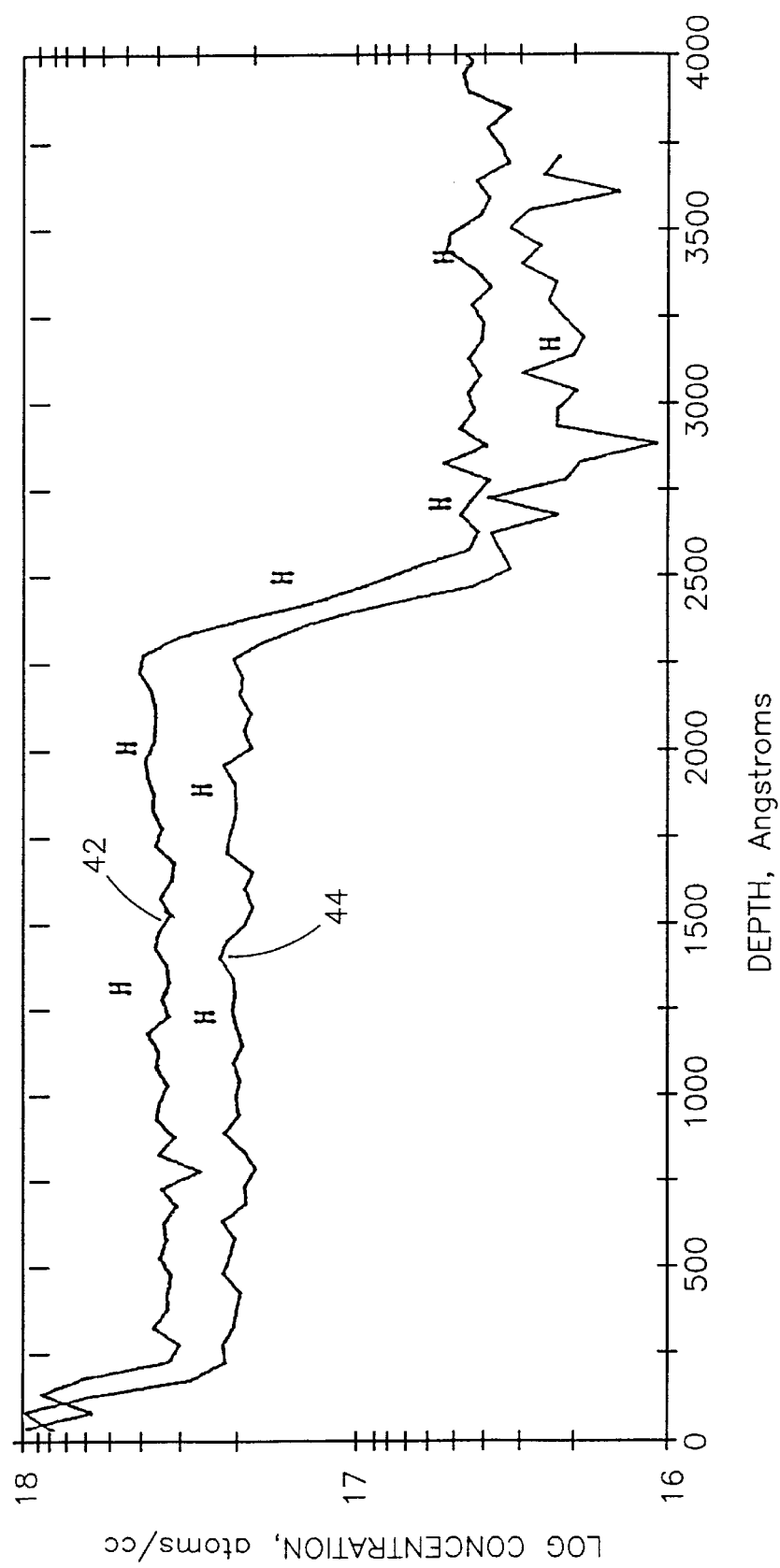
FIG. 4 is a graphical illustration showing the reduced hydrogen concentration of a silicon nitride hard mask after field oxidation is performed.

As indicated above, some amount of hydrogen is present in the silicon nitride hard mask 32 when deposited and after patterning, typically in the form of Si—H bonds or N—H bonds. The field oxidation of the exposed silicon to form regions 38 results in a decreased concentration of hydrogen as reflected in the graphical illustration of FIG. 4. FIG. 4 is a graphical illustration of the hydrogen concentration of a silicon nitride hard mask 32 both before and after field oxidation. Line 42 represents the hydrogen concentration of the silicon nitride hard mask before field oxidation and line 44 represents the hydrogen concentration after field oxidation. In this illustration, the silicon nitride layer is about 2500 Å in thickness and the hydrogen concentration before field oxidation is higher than after field oxidation for substantially this entire depth. The hydrogen concentration of the initial about 100 to 200 Å varies as this portion of the surface is representative of a silicon dioxide film that forms on the silicon nitride during the field oxidation step.

After the field oxidation is performed as illustrated in FIG. 3B, the silicon nitride hard mask 32 is removed as represented by block 16 of FIG. 1 and in more detail in FIG. 2. As shown in FIG. 2, the removal step 16 of the silicon nitride hard mask 32 is generally performed in two steps. First, the silicon hard mask is hydrogenated (block 18) and then a standard resist removal process is performed per step 20. The resulting profile of the device structure after the removal of the silicon nitride hard mask is shown in FIG. 3C.

Because the silicon nitride hard mask 32 has a decreased hydrogen concentration due to the field oxide formation step (block 14, FIG. 1), hydrogenation of the silicon nitride hard mask is performed to assist in the removal of the silicon nitride hard mask 32. With the hydrogenation assistance step (block 18), the speed of removal of the silicon nitride hard mask during the LOCOS process is increased relative to when a hydrogenation step is not performed. The hydrogenation process 18 generally includes either treating the silicon nitride hard mask 32 using pressurized water vapor, or alternatively, the silicon nitride hard mask 32 may be immersed in pressurized boiling water. Preferably, the silicon nitride hard mask 32 is treated with pressurized water vapor.

The hydrogenation of the silicon nitride hard mask 32 by immersion includes immersing the wafer being fabricated into pressurized boiling water in an appropriate pressurizable vessel. Generally, the pressurized boiling water may have a pressure in the range of about 2.0 atm to about 50.0 atm correlated with a temperature in the range of about 100° C. to about 300° C. More preferably, the pressurized boiling water has a temperature in the range of about 120° C. to about 200° C. correlated with a pressure in the range of about 2.0 atm to about 10.0 atm.

The hydrogenation of the silicon nitride hard mask 32 by treatment with pressurized water vapor includes exposing the silicon nitride hard mask 32 to the pressurized water vapor in an appropriate pressurizable vessel. Generally, the pressurized water vapor may have a pressure in the range of about 2.0 atm to about 50.0 atm correlated with a temperature in the range of about 100° C. to about 300° C. More preferably, the pressurized water vapor has a temperature in the range of about 120° C. to about 200° C. correlated with a pressure in the range of about 2.0 atm to about 10.0 atm.

In both hydrogenation methods, immersion in pressurized boiling water and treatment with pressurized water vapor, the longer the immersion and treatment time the greater the increase in hydrogen concentration of the silicon nitride hard mask 32. Immersion or treatment for a period of time greater than about 5 minutes will provide beneficial increases in hydrogen concentration and preferably the immersion or treatment time should be in the range of about 5 minutes to about 180 minutes. It should also be apparent that a silicon nitride hard mask may be subject to both of these methods and in any order. Further, the silicon nitride hard mask 32 may be treated or immersed more than once.

The immersion in the pressurized boiling water or the treatment to the pressurized water vapor may be performed utilizing deionized water in a pressurizable vessel or chamber such as a stainless steel vessel. In one instance, the pressurized boiling water or pressurized water vapor may be at a pressure of 2 atm and a temperature of 120° C. The level to which the water is deionized may be such that the electrical resistance is in the range of about 15 Mohms to about 18 Mohms. The heater, for example, may include any heating element operable in such a pressurized chamber or vessel, such as a stainless steel pipe which may lie in the water.

Preferably, the treatment of the silicon nitride hard mask 32 is performed in a high pressure oxidation unit sold under the trade designation GaSonics VHP, available from GaSonics, Inc. of San Jose, Calif. The GaSonics' unit is typically utilized for high pressure oxidation as described previously above with reference to FIG. 3B, with a dry oxygen source providing oxygen to the interior of the unit via a gas inlet to the unit. This same high pressure unit can then be used for hydrogenation utilizing a water vapor provided to the interior thereof via an inlet, such as the gas inlet of the unit, immediately following the field oxidation. The water vapor may be provided via the same inlet as the oxygen or the unit may be modified to provide another inlet for water vapor. Further, any such pressurizable unit suitable for performing both pressurized functions could be utilized.

Following the hydrogenation step 18, the silicon nitride hard mask 32 has a hydrogen concentration higher than the hydrogen concentration prior to such hydrogenation (i.e. immediately following field oxidation). Preferably, the hydrogen concentration of the silicon nitride hard mask 32 after the hydrogenation step is substantially equivalent to or greater than the hydrogen concentration of the silicon nitride hard mask 32 prior to the field oxidation formation step (block 14). After the hydrogenation of the silicon nitride hard mask 32, a standard silicon nitride hard mask removal process 42 can be utilized, to remove the hydrogenated silicon nitride hard mask 32 at an accelerated rate relative to a nonhydrogenated silicon nitride hard mask.

Many different types of conventional removal processes are known to those skilled in the art. Typically, a hot phosphoric acid strip is utilized to remove the silicon nitride hard mask 32. For example, the hot phosphoric acid strip may be performed at a temperature greater than about 155° C. It should be apparent to one skilled in the art that the temperature at which the hot phosphoric acid is utilized depends on the selectively and the etch rate the user wishes to achieve. Particularly, the selectivity to the field oxide regions 38 needs to be achieved. For example, an etch rate of about 40 to about 45 Å per minute may be achieve at 155° C. with suitable selectivity to the oxide.

Further, a silicon dioxide film may be formed on the silicon nitride hard mask 32 during the field oxidation step along with the outgassing of the hydrogen from the silicon nitride. This silicon dioxide film may require an etch prior to etching the silicon nitride hard mask 32, such as an HF vapor clean. A dry etching step may also be utilized, such as a plasma including a fluorine containing gas to remove the silicon dioxide.

The standard method of removing the silicon nitride hard mask after the hydrogenation thereof, results in the device structure profile 43 of FIG. 3C. The device structure profile 43 illustrates the field oxide regions 38 formed for isolation of the regions 44 available for further processing and construction of various devices, such as memory devices.

Although the invention has been described with particular reference to preferred embodiments thereof, variations and modifications to the present invention can be made within a contemplated scope of the claims as is readily known to one skilled in the art.

What is claimed is:

1. A method for use in the fabrication of semiconductor devices, the method comprising the steps of:
   providing a silicon nitride region;
   oxidizing a region of material in proximity to the silicon nitride region, wherein oxidizing the region includes providing a region of material at ambient conditions, subjecting the region of material to a set of oxidizing conditions resulting in an oxidized region, and thereafter returning the oxidized region to ambient conditions;

hydrogenating the silicon nitride region after the oxidized region is returned to ambient conditions by immersing the silicon nitride region into pressurized boiling water; and removing the hydrogenated silicon nitride region.

2. The method according to claim 1, wherein the pressurized boiling water has a pressure in a range of about 2 atm to about 50 atm correlated with a temperature in a range of about 100° C. to about 300° C.

3. The method according to claim 2, wherein the temperature is preferably in a range of about 120° C. to about 200° C. correlated with the pressure preferably in a range of about 2 atm to about 10 atm.

4. The method according to claim 1, wherein the material is a silicon substrate.

5. A method for use in the fabrication of semiconductor devices, the method comprising the steps of:

providing a silicon nitride region;

oxidizing a region of material in proximity to the silicon nitride region, wherein oxidizing the region includes providing a region of material at ambient conditions, subjecting the region of material to a set of oxidizing conditions resulting in an oxidized region, and thereafter returning the oxidized region to ambient conditions;

hydrogenating the silicon nitride region after the oxidized region is returned to ambient conditions by treating the silicon nitride region with pressurized water vapor; and removing the hydrogenated silicon nitride region.

6. The method according to claim 5, wherein the pressurized water vapor has a pressure in a range of about 2 atm to about 50 atm correlated with a temperature in a range of about 100° C. to about 300° C.

7. The method according to claim 6, wherein the temperature is preferably in a range of about 120° C. to about 200° C. and the pressure is preferably in a range of about 2 atm to about 10 atm.

8. The method according to claim 5, wherein the oxidation step is performed in a high pressure oxidation device and further wherein the hydrogenation step includes treating the silicon nitride region with pressurized water vapor using the high pressure oxidation device.

9. A method of etching silicon nitride in a local oxidation of silicon process, the method comprising the steps of:

providing a silicon substrate;

providing a silicon nitride hard mask above the silicon substrate exposing areas of silicon substrate;

oxidizing the exposed areas of silicon substrate, wherein oxidizing the exposed areas of silicon substrate includes providing the exposed areas of silicon substrate at ambient conditions, subjecting the exposed areas of silicon substrate to a set of oxidizing conditions resulting in oxidized areas, and thereafter returning the oxidized areas to ambient conditions;

increasing a hydrogen concentration of the silicon nitride hard mask after the oxidized areas are returned to ambient conditions by immersion into pressurized boiling water; and removing the silicon nitride hard mask.

10. The method according to claim 9, wherein the pressurized boiling water has a temperature in a range of about 100° C. to about 300° C. correlated with a pressure in a range of about 2 atm to about 50 atm in a pressurizable unit.

11. The method according to claim 9, wherein the removing step includes removing the hydrogenated silicon nitride hard mask with hot phosphoric acid.

12. The method according to claim 9, wherein the increasing step includes increasing the hydrogen concentration from a first concentration resulting from the oxidation step to a second concentration higher than the first concentration.

13. The method according to claim 12, wherein the increasing step further includes increasing the hydrogen concentration from the first concentration to a second concentration substantially equivalent to or greater than the hydrogen concentration of the silicon nitride hard mask prior to the oxidation step.

14. A method of etching silicon nitride in a local oxidation of silicon process, the method comprising the steps of:

providing a silicon substrate;

providing a silicon nitride hard mask above the silicon substrate exposing areas of silicon substrate;

oxidizing the exposed areas of silicon substrate, wherein oxidizing the exposed areas of silicon substrate includes providing the exposed areas of silicon substrate at ambient conditions, subjecting the exposed areas of silicon substrate to a set of oxidizing conditions resulting in oxidized areas, and thereafter returning the oxidized areas to ambient conditions;

increasing a hydrogen concentration of the silicon nitride hard mask after the oxidized areas are returned to ambient conditions by treating the silicon nitride mask with pressurized water vapor; and removing the silicon nitride hard mask.

15. The method according to claim 14, wherein the pressurized water vapor has a temperature in a range of about 100° C. to about 300° C. correlated with a pressure in a range of about 2 atm to about 50 atm in a pressurizable unit.

16. The method according to claim 14, wherein the oxidizing step and the increasing step are performed in a same pressurizable unit.

17. An etching method for removing a silicon nitride region after oxidation of nearby material, the method comprising the steps of:

providing the silicon nitride region at ambient conditions;

hydrogenating the silicon nitride region by immersing the silicon nitride region in pressurized boiling water; and removing the hydrogenated silicon nitride region.

18. The method according to claim 17, wherein the pressurized boiling water has a temperature in a range of about 100° C. to about 300° C. correlated with a pressure in a range of about 2 atm to about 50 atm in a pressurizable unit.

19. An etching method for removing a silicon nitride region after oxidation of nearby material, the method comprising the steps of:

providing the silicon nitride region at ambient conditions;

hydrogenating the silicon nitride region by treating the silicon nitride region with pressurized water vapor; and removing the hydrogenated silicon nitride region.

20. The method according to claim 19, wherein the pressurized water vapor has a temperature in a range of about 100° C. to about 300° C. correlated with a pressure in a range of about 2 atm to about 50 atm in a pressurizable unit.

21. An etching method for removing a silicon nitride region after high pressure oxidation of material in proximity to the silicon nitride in a high pressure oxidation device, the method comprising the steps of:

providing the silicon nitride region at ambient conditions in the high pressure oxidation device after high pressure oxidation of the material in proximity to the silicon nitride is completed;

hydrogenating the silicon nitride region by treating the silicon nitride region with pressurized water vapor using the high pressure oxidation device; and removing the hydrogenated silicon nitride region.

22. A method for use in the fabrication of semiconductor devices, the method comprising the steps of:

providing a silicon nitride region;

oxidizing a region of material in proximity to the silicon nitride region;

hydrogenating the silicon nitride region after the region of material is oxidized, wherein hydrogenating the silicon nitride region includes immersing the silicon nitride region into pressurized boiling water having a pressure in a range of about 2 atm to about 50 atm correlated with a temperature in a range of about 100° C. to about 300° C., and further wherein the silicon nitride region is immersed in the pressurized boiling water for a time period greater than about 5 minutes; and removing the hydrogenated silicon nitride region.

23. The method according to claim 22, wherein the temperature is in a range of about 120° C. to about 200° C. and the pressure is in a range of about 2 atm to about 10 atm.

24. A method for use in the fabrication of semiconductor devices, the method comprising the steps of:

providing a silicon nitride region;

oxidizing a region of material in proximity to the silicon nitride region;

hydrogenating the silicon nitride region after the region of material is oxidized, wherein hydrogenating the silicon nitride region includes treating the silicon nitride region with pressurized water vapor having a pressure in a range of about 2 atm to about 50 atm correlated with a temperature in a range of about 100° C. to about 300° C., and further wherein the silicon nitride region is treated with pressurized water vapor for a time period greater than about 5 minutes; and removing the hydrogenated silicon nitride region.

25. The method according to claim 24, wherein the temperature is in a range of about 120° C. to about 200° C. and the pressure is in a range of about 2 atm to about 10 atm.

26. A method of etching silicon nitride in a local oxidation of silicon process, the method comprising the steps of:

providing a silicon substrate;

providing a silicon nitride hard mask above the silicon substrate exposing areas of silicon substrate;

oxidizing the exposed areas of silicon substrate;

increasing a hydrogen concentration of the silicon nitride hard mask after oxidation of the exposed areas of silicon substrate, wherein increasing the hydrogen concentration includes hydrogenating the silicon nitride hard mask by immersion into pressurized boiling water having a temperature in a range of about 100° C. to about 300° C. correlated with a pressure in a range of about 2 atm to about 50 atm for a time period greater than about 5 minutes; and removing the silicon nitride hard mask.

27. The method according to claim 26, wherein the removing step includes removing the hydrogenated silicon nitride hard mask with hot phosphoric acid.

28. The method according to claim 26, wherein the increasing step includes increasing the hydrogen concentration from a first concentration resulting from the oxidation step to a second concentration higher than the first concentration.

29. The method according to claim 28, wherein the increasing step further includes increasing the hydrogen concentration from the first concentration to a second concentration substantially equivalent to or greater than the hydrogen concentration of the silicon nitride hard mask prior to the oxidation step.

30. The method according to claim 26, wherein the oxidizing step and the increasing step are performed in a same pressurizable unit.

31. A method of etching silicon nitride in a local oxidation of silicon process, the method comprising the steps of:

providing a silicon substrate;

providing a silicon nitride hard mask above the silicon substrate exposing areas of silicon substrate;

oxidizing the exposed areas of silicon substrate;

increasing a hydrogen concentration of the silicon nitride hard mask after oxidation of the exposed areas of silicon substrate, wherein increasing the hydrogen concentration includes hydrogenating the silicon nitride hard mask by treating the silicon nitride mask with pressurized water vapor having a temperature in a range of about 100° C. to about 300° C. correlated with a pressure in a range of about 2 atm to about 50 atm for a time period greater than about 5 minutes; and removing the silicon nitride hard mask.

32. The method according to claim 31, wherein the removing step includes removing the hydrogenated silicon nitride hard mask with hot phosphoric acid.

33. The method according to claim 31, wherein the increasing step includes increasing the hydrogen concentration from a first concentration resulting from the oxidation step to a second concentration higher than the first concentration.

34. The method according to claim 33, wherein the increasing step further includes increasing the hydrogen concentration from the first concentration to a second concentration substantially equivalent to or greater than the hydrogen concentration of the silicon nitride hard mask prior to the oxidation step.

35. The method according to claim 31, wherein the oxidizing step and the increasing step are performed in a same pressurizable unit.

36. An etching method for removing a silicon nitride region after oxidation of nearby material, the method comprising the steps of:

hydrogenating the silicon nitride region by immersing the silicon nitride region in pressurized boiling water having a temperature in a range of about 100° C. to about 300° C. correlated with a pressure in a range of about 2 atm to about 50 atm for a time period greater than about 5 minutes; and removing the hydrogenated silicon nitride region.

37. An etching method for removing a silicon nitride region after oxidation of nearby material, the method comprising the steps of:

hydrogenating the silicon nitride region by treating the silicon nitride region with pressurized water vapor having a temperature in a range of about 100° C. to about 300° C. correlated with a pressure in a range of about 2 atm to about 50 atm for a time period greater than about 5 minutes; and removing the hydrogenated silicon nitride region.

* * * * *